United States Patent [19]
DeMeester et al.

[11] Patent Number: 6,029,081
[45] Date of Patent: Feb. 22, 2000

[54] MOVABLE MAGNETS FOR MAGNETIC RESONANCE SURGERY

[75] Inventors: Gordon D. DeMeester, Wickliffe, Ohio; Ian R. Young, Wiltshire, United Kingdom

[73] Assignee: Picker International, Inc., Highland Heights, Ohio

[21] Appl. No.: 09/044,425

[22] Filed: Mar. 19, 1998

[51] Int. Cl.[7] .................................................. A61B 5/055
[52] U.S. Cl. .......................... 600/410; 324/318; 335/298
[58] Field of Search ...................................... 600/410, 415, 600/421; 324/318, 259; 348/11, 17, 20, 39; 335/298, 237

[56] References Cited

U.S. PATENT DOCUMENTS

| | | |
|---|---|---|
| Re. 36,099 | 2/1999 | Gordon . |
| 4,337,449 | 6/1982 | Oudet . |
| 4,587,493 | 5/1986 | Sepponen . |
| 4,808,957 | 2/1989 | Furukawa . |
| 4,875,485 | 10/1989 | Matsutani . |
| 4,891,596 | 1/1990 | Mitomi . |
| 4,985,678 | 1/1991 | Gangarosa et al. . |
| 5,014,292 | 5/1991 | Siczek et al. . |
| 5,020,089 | 5/1991 | Cramer et al. . |
| 5,086,448 | 2/1992 | Muthmann . |
| 5,144,241 | 9/1992 | Oppelt et al. . |
| 5,150,710 | 9/1992 | Hall et al. . |
| 5,153,546 | 10/1992 | Laskaris . |
| 5,155,757 | 10/1992 | Sakaniwa et al. . |
| 5,197,474 | 3/1993 | Englund et al. . |
| 5,221,902 | 6/1993 | Jones et al. . |
| 5,307,806 | 5/1994 | Jones . |
| 5,378,988 | 1/1995 | Pulyer . |
| 5,386,453 | 1/1995 | Harrawood et al. . |
| 5,410,584 | 4/1995 | Schaefer et al. . |
| 5,423,315 | 6/1995 | Margosian et al. . |
| 5,436,607 | 7/1995 | Chari et al. . |
| 5,473,251 | 12/1995 | Mori . |
| 5,497,408 | 3/1996 | Kayser . |
| 5,519,372 | 5/1996 | Palkovich et al. . |
| 5,521,957 | 5/1996 | Hansen . |
| 5,528,212 | 6/1996 | Challenger et al. . |
| 5,541,856 | 7/1996 | Hammermeister . |
| 5,565,834 | 10/1996 | Hanley et al. . |
| 5,570,409 | 10/1996 | Yamaguchi et al. . |
| 5,627,471 | 5/1997 | Kinanen . |
| 5,627,873 | 5/1997 | Hanover et al. . |
| 5,663,645 | 9/1997 | Kaufman et al. . |
| 5,680,086 | 10/1997 | Allis et al. . |
| 5,729,188 | 3/1998 | Siebold et al. . |
| 5,735,278 | 4/1998 | Hoult et al. . |
| 5,779,637 | 7/1998 | Palkovich et al. . |
| 5,825,843 | 10/1998 | Kobayashi . |

*Primary Examiner*—Marvin M. Lateef
*Assistant Examiner*—Shawna Shaw
*Attorney, Agent, or Firm*—Fay, Sharpe, Fagan, Minnich & McKee, LLP

[57] ABSTRACT

A magnetic resonance imaging apparatus (10) includes a couch (54) for supporting a region of interest of a subject (44) being examined in an examination region. A main magnet for generating a substantially uniform temporally constant main magnetic field through the examination region includes a stationary pole piece (24), a movable pole piece (22), a ferrous flux return path (26), and a magnetic flux generator that selectively generates magnetic flux that flows between the pole pieces (22, 24) through the examination region and through the ferrous flux return path (26) which connects the pole pieces (22, 24). The stationary pole piece (24) is arranged adjacent a first side of the examination region. The movable pole piece (22) is arranged to be selectively moved between a first position adjacent a second side of the examination region opposite the stationary pole piece (24) so that the stationary and movable pole pieces (24, 22) define the examination region therebetween, and a second position remote from the examination region.

14 Claims, 8 Drawing Sheets

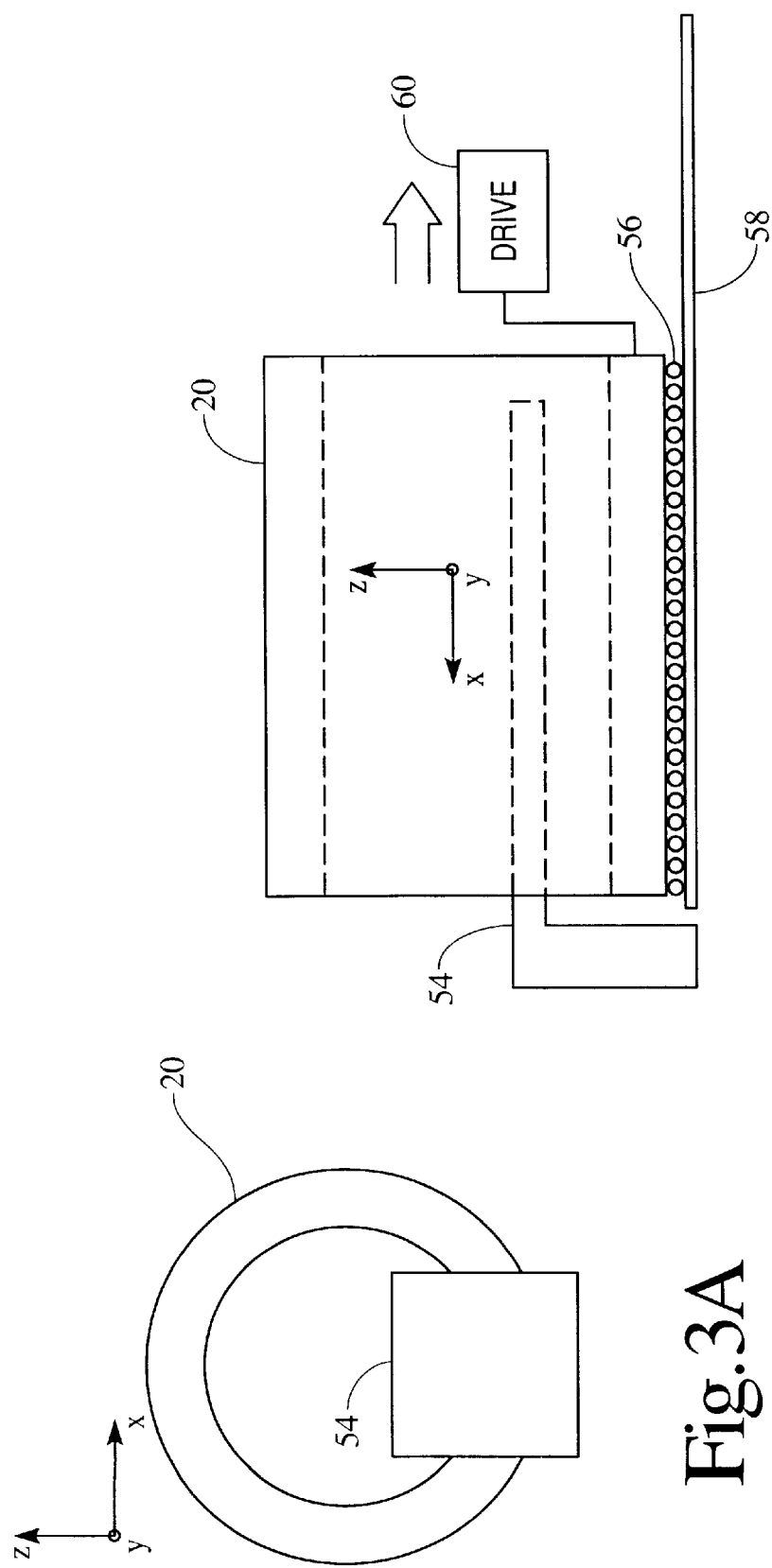

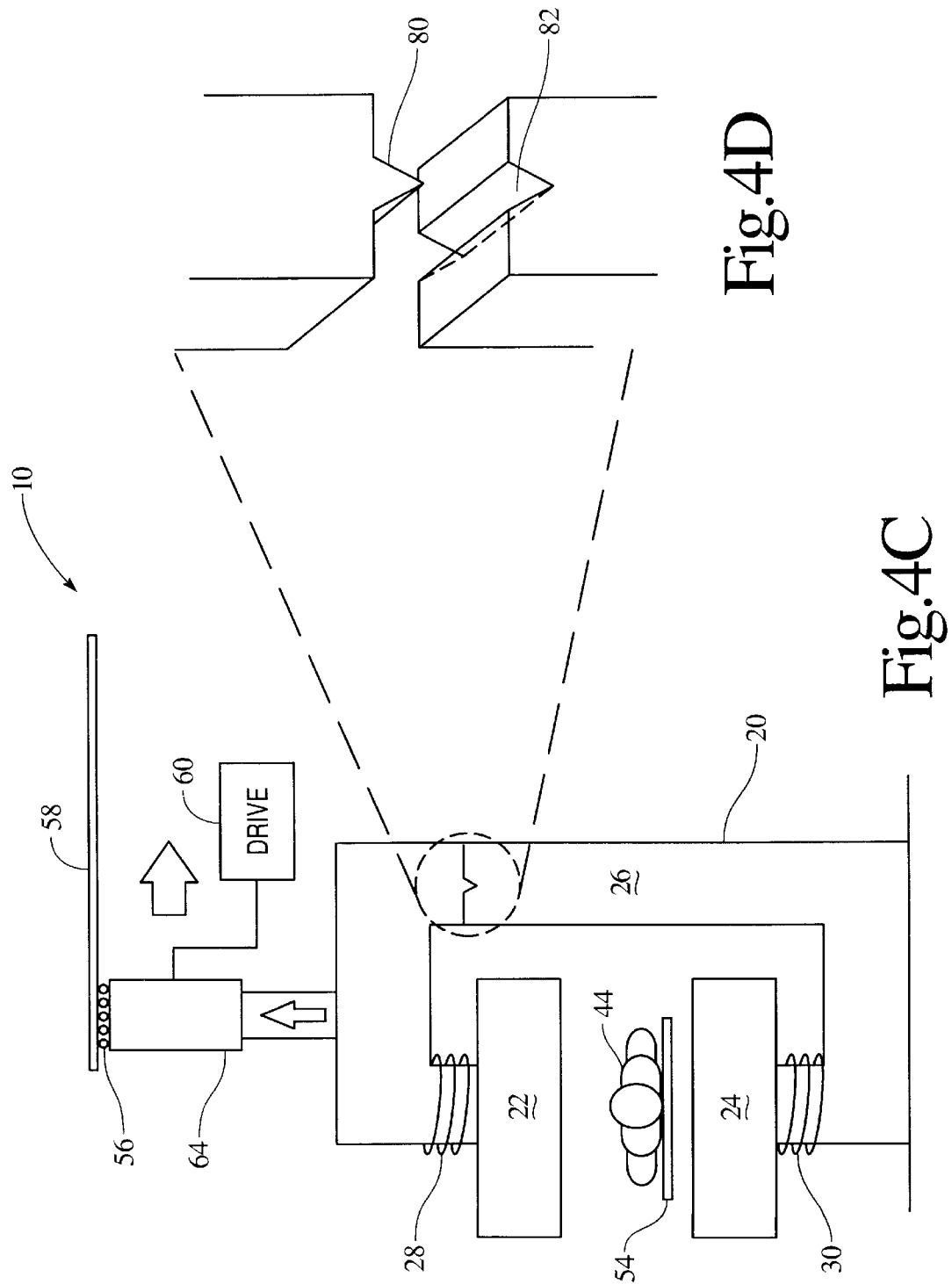

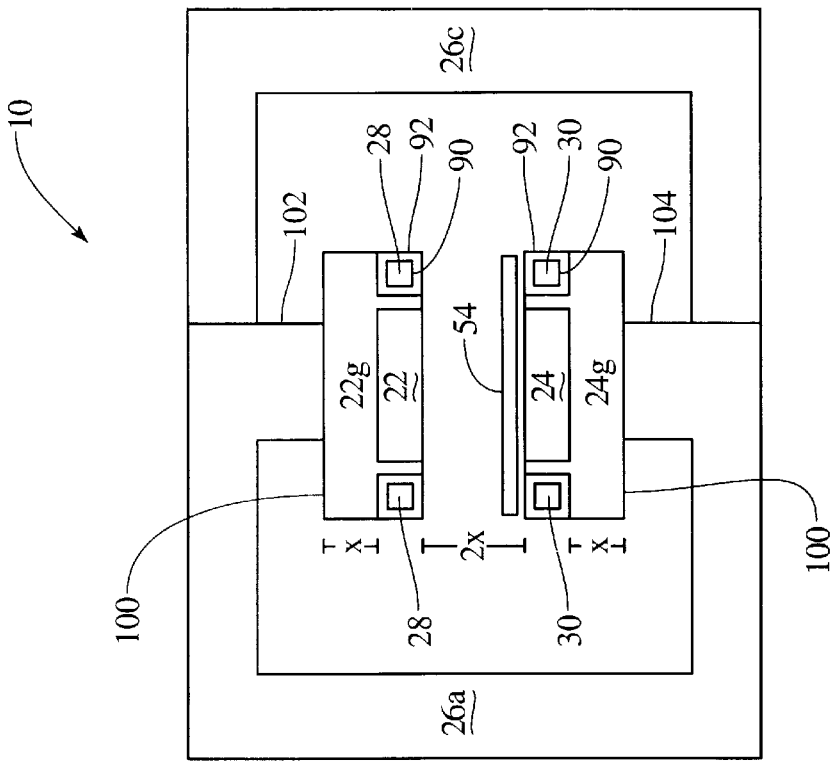
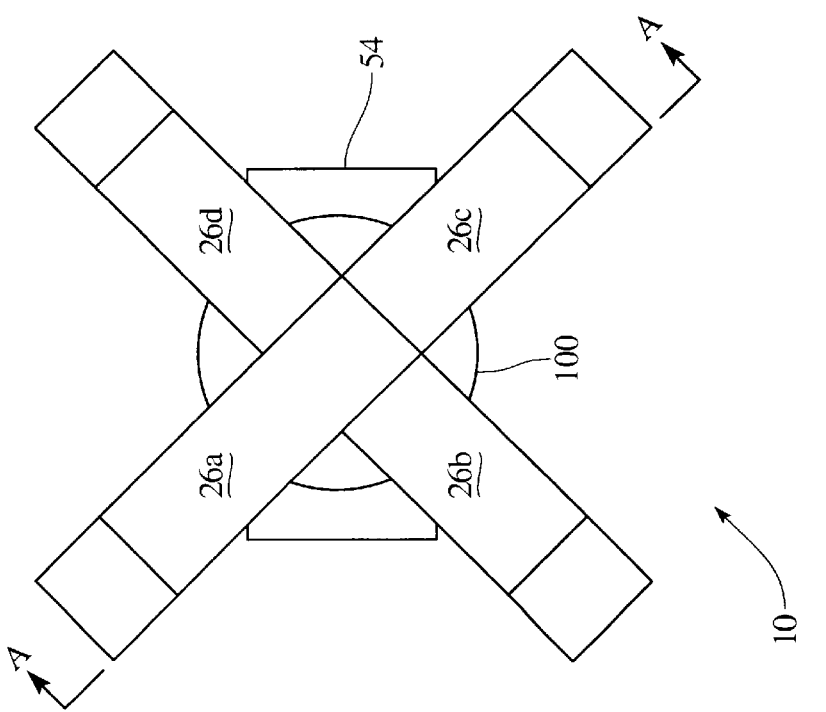
Fig.5B
Fig.5A

MOVABLE MAGNETS FOR MAGNETIC RESONANCE SURGERY

BACKGROUND OF THE INVENTION

The present invention relates to the magnetic resonance arts. It finds particular application in conjunction with medical diagnostic magnetic resonance imaging and will be described with particular reference thereto. However, it is to be appreciated that the present invention is also amenable to magnetic resonance spectroscopy and magnetic resonance imaging for other applications.

Generally, nuclear magnetic resonance (NMR) and magnetic resonance imaging (MRI) techniques employ a spatially uniform and temporally constant main magnetic field, $B_0$, generated through an examination region in which a patient or subject being examined is placed. Conventionally, the uniform main magnetic field is generated in one of two ways. The first method employs a cylindrically shaped solenoidal main magnet. The central bore of the main magnetic defines the examination region in which a horizontally direct main magnetic field is generated. The second method employs a main magnet having an open geometry. Typically the main magnet has opposing pole pieces arranged facing one another to define the examination region therebetween. The pole pieces are connected by a ferrous flux return path. This configuration generates a substantially uniform vertical main magnetic field within the examination region. Open geometry main magnets have been able to solve important MRI issues such as, increasing patient aperture, avoiding patient claustrophobia, and improving access for interventional MRI applications.

A number of interventional MRI procedures such as biopsies, laser ablation, and other procedures are done on both the horizontal bore cylindrical type magnet systems as well as the vertical field open geometry magnet systems. However, the range of procedures is limited due to the presence of the cryostat, poles, and/or other magnet structures surrounding the patient. This limits access to the patient for surgery and determines such things as the available patient positions, types and size of equipment that may be employed, and the like. Consequently, many MRI interventional procedures are done staged. Staged procedures involve imaging the patient and then moving the patient to a different location and/or position for surgery. Additional images are obtained by moving the patient back into the imaging region. However, staged procedures are accompanied by certain inherent drawbacks. For example, in many types of surgery patient movement is unwanted and in this regard staged procedures are unsuitable. Furthermore, subsequent images may not properly align with previous images as repositioning the patient in the same exact location within the examination region is extremely difficult. As the procedure progresses, this may lead to faulty predictions regarding the location of a patient's anatomy.

In cases of emergency or complications during surgery, a high degree of patient access is desirable. However, the horizontal bore cylindrical magnet systems lack sufficient access in this regard. While the open geometry magnet systems provide improved access over the cylindrical magnet systems, in certain emergency circumstances this degree of access is still too limited.

More recently, many surgical procedures are done using a minimally invasive approach. Such an approach is generally easier on the patient, promotes the quickest recovery, and is often the least expensive. Some types of minimally invasive surgery have been facilitated through the use of image guided surgery techniques. High patient access in these types of surgery is extremely advantageous from several perspectives. First, it is necessary for the surgeon to have access to the surgery site. Second, there are preferred patient positions for the different surgeries. Finally, there are a variety of patient support items (tubes, wires, and the like) which are employed during the surgery and take up a certain amount of space. Furthermore, it is desirable that the entire surgery team which may include a number of surgeons and/or support personnel have access to the patient in order to properly fulfill their role in the surgery. However, generally speaking the MRI systems mentioned above do not provide the requisite access to achieve these goals.

The present invention contemplates a new and improved magnetic resonance imaging apparatus which overcomes the above-referenced problems and others.

SUMMARY OF THE INVENTION

In accordance with one aspect of the present invention, a magnetic resonance apparatus includes a stationary couch for supporting a subject being examined. A main magnet generates a substantially uniform temporarily constant main magnetic field through an examination region. The main magnet is mounted such that a portion of the magnet is selectively moveable over a range of positions including at least a first position in which a region of interest of the subject is in the examination region and a second position in which at least the movably mounted portion of the main magnet is displaced from the region of interest of the subject.

In accordance with a more limited aspect of the present invention, the main magnet includes two opposing pole pieces which define the examination region therebetween. The moveable main magnet also includes a ferrous flux return path connecting the two opposing pole pieces.

In accordance with a more limited aspect of the present invention, a drive is provided which rotates the main magnet about a vertical axis.

In accordance with a more limited aspect of the present invention, a drive is provided which translates the main magnet along a track in a predefined path.

In accordance with a more limited aspect of the present invention, the main magnet is a cylindrical magnet having a horizontal axis and a central axial bore which defines the examination region.

In accordance with a more limited aspect of the present invention, a drive is provided which translates the main magnet along a track in a direction substantially parallel to the horizontal axis.

In accordance with another aspect of the present invention, a magnetic resonance imaging apparatus includes a couch for supporting a region of interest of a subject being examined in an examination region. A main magnet generates a substantially uniform temporarily constant main magnetic field through the examination region. The main magnet includes a stationary pole piece arranged adjacent a first side of the examination region. A moveable pole piece is arranged to be selectively moved between a first position adjacent a second side of the examination region opposite the stationary pole piece so that the stationary and moveable pole pieces define the examination region therebetween, and a second position remote from the examination region. A ferrous flux return path connects the stationary and moveable pole pieces. A magnetic flux generator selectively generates a magnetic flux that flows between the pole pieces through the examination region and through the ferrous flux return path.

In accordance with a more limited aspect of the present invention, the ferrous flux return path includes at least two sections with abutting surfaces. A first section is connected to the stationary pole piece and a second section is connected to the movable pole piece. When the second section is moved relative to the first section, the movable pole piece is selectively moved between the first and second positions.

In accordance with a more limited aspect of the present invention, when the movable pole piece is in the first position the abutting surfaces of the sections are in physical contact with one another. As the magnetic flux generator is energized to generate magnetic flux, electromagnetic forces urge the pole pieces into alignment and urge the sections into abutment.

In accordance with a more limited aspect of the present invention, the first section and the second section are pivotally connected with each other.

In accordance with a more limited aspect of the present invention, a pin is disposed on one of the first and second section, and a pin receptor is disposed on the other. The pin is received in the pin receptor when the movable pole piece is in the first position to facilitate mechanical alignment of the movable and stationary pole pieces.

In accordance with another aspect of the present invention, a method of magnetic resonance imaging is provided. It includes supporting a region of interest of a subject within an examination region. The subject is kept stationary and at least a portion of a main magnet which generates a substantially uniform temporally constant main magnetic field is moved from a remote location to a location adjacent the examination region. The magnetic resonance imaging is performed and at least the portion of the main magnet is returned to the remote location.

In accordance with a more limited aspect of the present invention, the steps of moving and returning include rotating at least a portion of the main magnet about a vertical axis.

In accordance with a more limited aspect of the present invention, the steps of moving and returning include rotating at least the portion of the main magnet about a horizontal axis.

In accordance with a more limited aspect of the present invention, the steps of moving and returning include translating at least the portion of the main magnet along a track.

In accordance with a more limited aspect of the present invention, a medical diagnostic image of the region of interest is generated as a result of the magnetic resonance imaging and an invasive medical procedure is performed in the region of interest after the portion of the main magnet is moved to the remote location.

In accordance with a more limited aspect of the present invention, the steps of moving and returning include moving and returning an upper pole piece between the remote location and a location adjacent and above the subject while maintaining a lower pole piece stationary and below the subject.

One advantage of the present invention resides in its high patient access.

Another advantage of the present invention is that it may be employed for a wide range of surgical procedures.

Another advantage of the present invention is the minimization of patient movement during surgical procedures.

Another advantage of the present invention is reduced mechanical constrains associated with the movement of the magnet.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating preferred embodiments and are not to be construed as limiting the invention.

FIGS. 3A and 3B are diagrammatic illustrations of an end view and side view respectively of a magnetic resonance imaging apparatus in accordance with the present invention;

FIGS. 4A, 4B, 4C, and 4D are diagrammatic illustrations of of a magnetic resonance imaging apparatus wherein only a portion of the main magnet is moved in accordance with the present invention;

DETAILED DESCRIPTION OF THE PREFERRED EMBODIMENT

Figure 1:
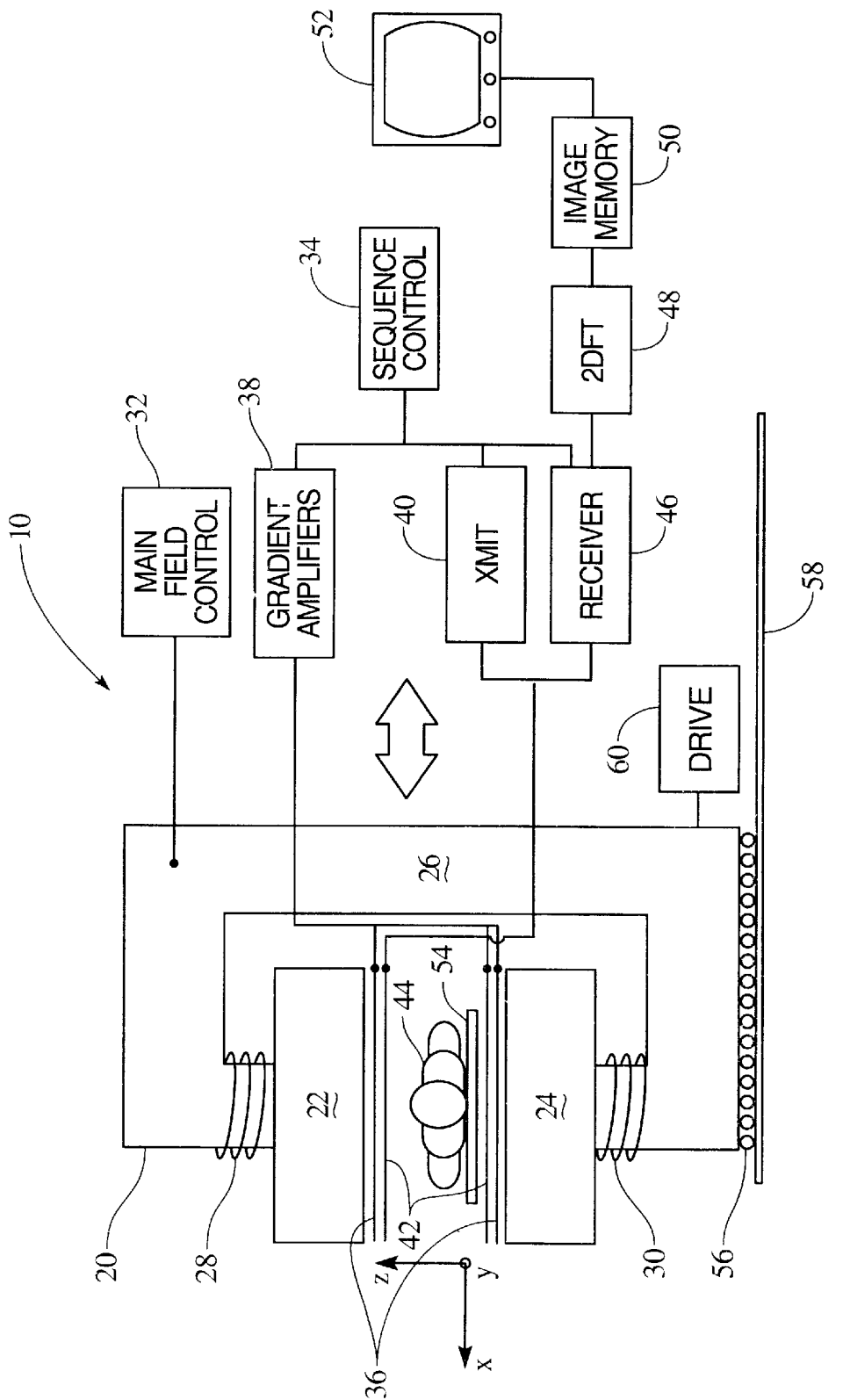
FIG. 1 is a diagrammatic illustration of a side view of a magnetic resonance imaging apparatus in accordance with the present invention.

With reference to FIG. 1, a magnetic resonance imaging apparatus 10 includes a main magnet 20 which generates a main magnetic field through an examination region which is defined by opposing symmetrical magnetic pole pieces 22, 24 of the main magnet 20. The pole pieces 22, 24 serve to improve the quality of the main magnetic field in the gap therebetween. Preferably, the main magnetic field is a strong substantially uniform temporally constant field that is aligned with a z or vertical axis. In the illustrated embodiment, the opposing magnetic pole pieces 22, 24 are connected by a ferrous flux return path 26, such as a C- or U-shaped iron element. Resistive or superconducting main field coils 28, 30 are operated under control of a main magnetic field control circuit 32 to induce the main magnetic field between the opposing magnetic pole pieces 22, 24 in the examination region and a magnetic flux in the ferrous flux return path 26. Alternately, the iron element may be a permanent magnet which generates the main magnetic field within the examination region. Preferably, the main field coils 28, 30 include coil segments disposed adjacent to or in conjunction with each of the opposing magnetic pole pieces 22, 24. However, the main field coils 28, 30 can be disposed anywhere along the ferrous flux return path 26.

A magnetic resonance echo means operated under the control of a sequence control circuit 34 applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, a gradient coil assembly 36 selectively creates magnetic gradients in the main magnetic field across the examination region via gradient current amplifiers 38 that apply electrical current pulses to the gradient coil assembly 36. Preferably, the gradient coil assembly includes self shielded gradient coils for producing magnetic gradients along three mutually orthogonal axes, x, y, and z.

An RF transmitter 40 (optionally digital) transmits radio frequency pulses or pulse packets to a whole-body RF coil 42 disposed adjacent the examination region to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up by the whole-body RF coil 42. The RF coil may be disposed near the opposing magnetic pole pieces 22, 24, (as is the whole-body RF coil 42 illustrated) or on the subject 44 being examined. For example, a surface coil may be positioned contiguous to the subject 44 being examined for controllably inducing magnetic resonance in a selected region of the subject 44.

A receiver 46 (preferably a digital receiver) receives signals from resonating dipoles within the examination region. The signals are received via the same RF coil that transmits the radio frequency pulses. Alternately, separate receiver coils may be used. For example, receive only surface coils may be disposed continuous to a selected region of the subject 44 being examined to receive resonance induced therein by the whole-body RF transmitting coil 42 surrounding the examination region. The sequence control circuit 32 controls the gradient pulse amplifiers 38 and the transmitter 40 to generate any of a plurality of multiple echo sequences, such as echo-planar imaging, echo-volume imaging, gradient and spin echo imaging, fast spin echo imaging, and the like. For the selected sequence, the receiver 46 receives a plurality of data inputs in rapid succession following each RF excitation pulse. Ultimately, the radio frequency signals received are demodulated and reconstructed into an image representation by a reconstruction processor 48 which applies a two-dimensional Fourier transform or other appropriate reconstruction algorithm. The image may represent a planar slice through the patient, an array of parallel planar slices, a three-dimensional volume, or the like. The image is then stored in an image memory 50 where it may be accessed by a display, such as a video monitor 52 which provides a human viewable display of the resultant image.

A couch 54 suspends a subject 44 to be examined at least partially within the examination region (i.e., so that a region of interest is in the examination region). In a preferred embodiment, the couch 54, and consequently the subject 44, remains substantially stationary throughout the magnetic resonance imaging process and throughout any accompanying surgical procedures. For increased access to the patient or subject 44, the main magnet 20 is ramped down and moved as indicated by the arrow so that the patient or subject 44 is wholly outside the examination region. In the illustrated embodiment, the main magnet 20 is mounted on rollers or wheels 56 which engage a track 58 laid out on the floor. In this manner, the main magnet 20 can be translated to a remote location away from the subject 44 being examined. Hence, a surgical team is permitted unfettered access to the subject 44. Should additional images be desired, the main magnet 20 is repositioned about the subject 44 without moving the subject 44. While depicted as being moved away from the couch 54 perpendicular to its longitudinal axis, depending on available space and design preferences, the main magnet 20 may be shifted in any desired direction, for example in a direction parallel to the longitudinal axis of the couch 54. Drive systems 60 are employed to direct and/or facilitate the main magnet's movement such as motors, skids, hydraulics, gears, cable, pulleys, and the like. Brakes and guides (not illustrated) are employed for stationary placement and accurate alignment of the main magnet 20.

Figure 2:
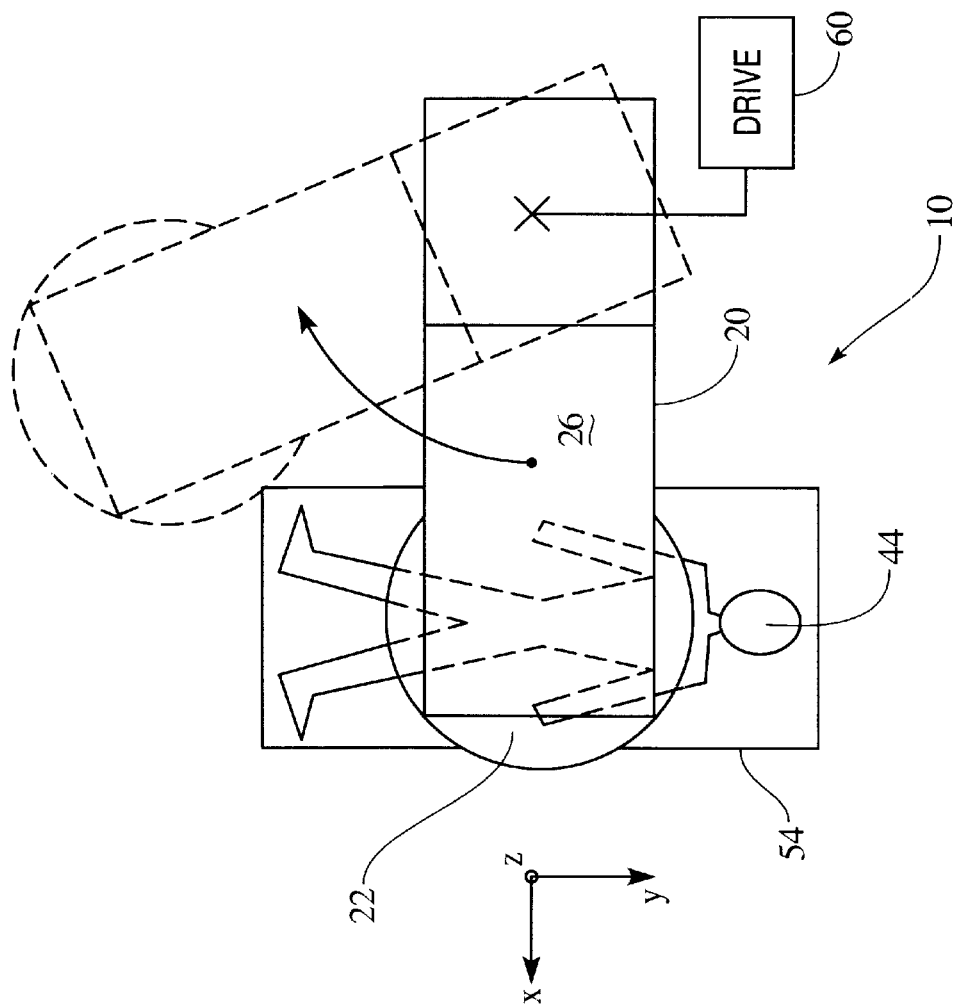
FIG. 2 is a diagrammatic illustration of a top view of a magnetic resonance imaging apparatus in accordance with the present invention.

Optionally, as illustrated in FIG. 2, the main magnet 20 is moved by rotating it about a vertical axis to a position where the pole pieces 22, 24 are no longer on opposite sides of the subject 44. In a preferred embodiment, the vertical axis of rotation is concentric with a vertically extending portion of the ferrous flux return path 26. Alternately, the vertical axis of rotation extends through the center of gravity of the main magnet 20.

In an alternate embodiment as illustrated in FIGS. 3A and 3B, the MRI apparatus 10 includes a cylindrically shaped main magnet 20 for generating the main magnetic field horizontally through its central bore which defines the examination region. In this embodiment, the main magnet 20 is moved by translating it in a direction parallel to its central axis.

Figure 4A:
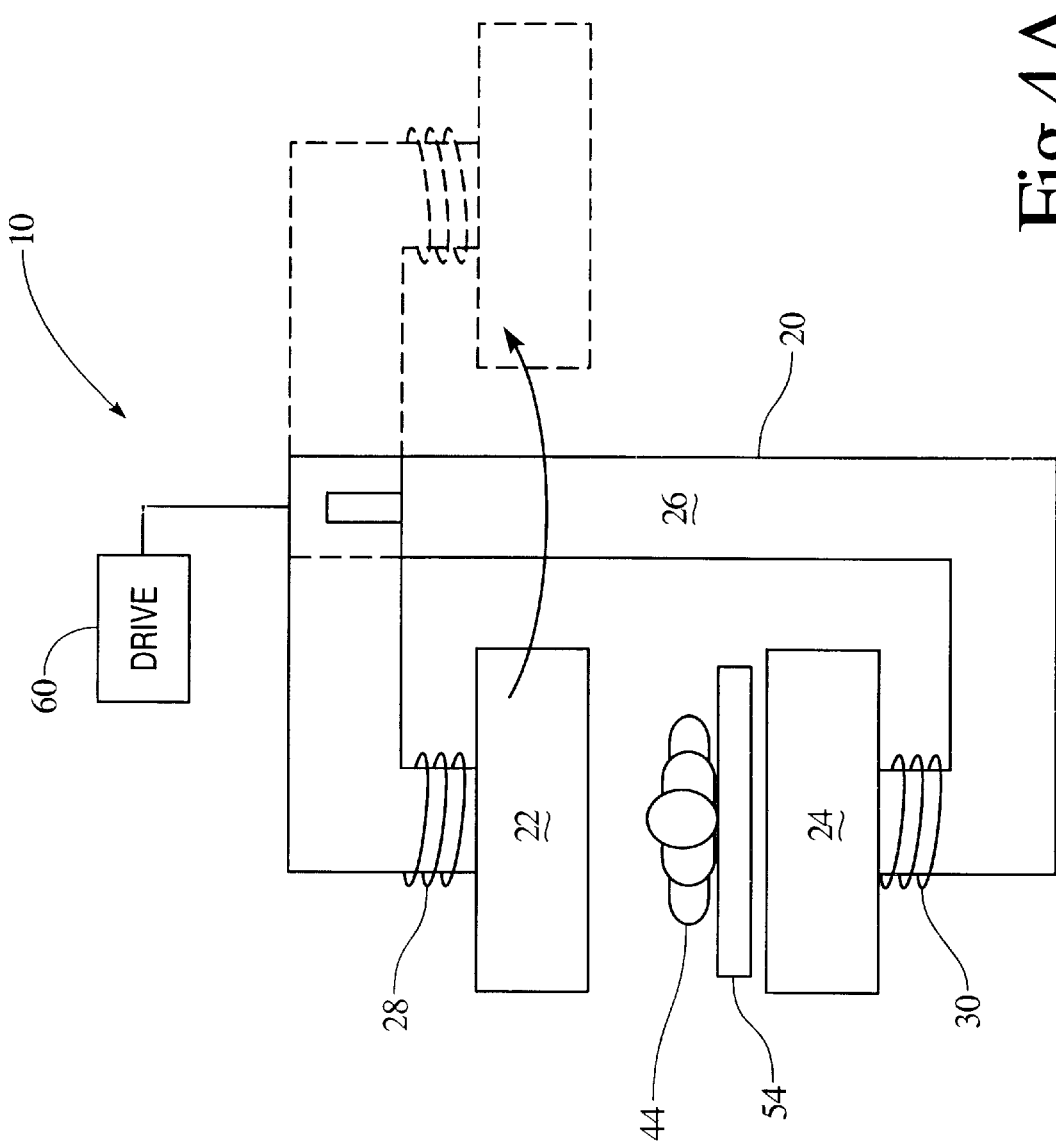
Figure 4B:
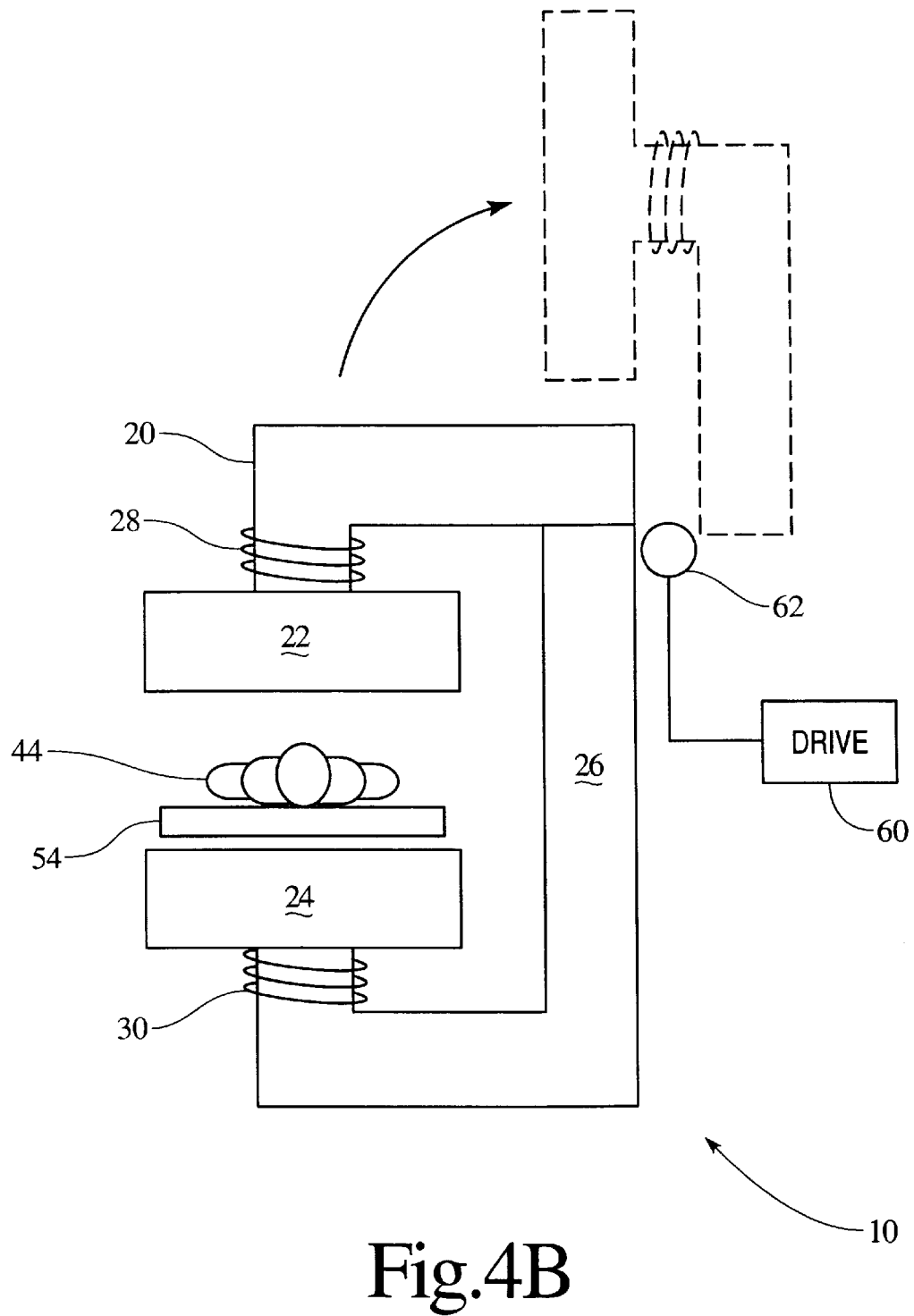

With reference to FIGS. 4A through 4D, in these embodiments after ramping down the main magnet 20, only a portion of the MRI apparatus 10 is moved to increase access to the subject 44. More specifically, an upper portion of the main magnet 20 is removed to a remote location away from the stationary couch 54 and consequently away from the subject 44 supported thereon. By moving only the upper portion of the main magnet 20 while letting a lower portion remain in place, mechanical constraints associated with moving the structures are eased due to the decreased mass and volume that is being moved. Furthermore, the degree of access is not greatly sacrificed as the lower portion of the main magnet 20 resides below the couch 54 where access is generally not desired. In order to disconnect the upper portion of the main magnet 20 from the lower portion, the ferrous flux return path 26 is separated into two pieces or sections such that the upper piece along with the pole piece 22, the main field coil 28, and other associated structure is moved to a remote location. In a preferred embodiment, the ferrous flux return path is separated along the vertically extending portion thereof. optionally, the upper portion of the main magnet 20 is then selectively moved out of the way by either: rotating it about a vertical axis concentric with the vertically extending portion of the ferrous flux return path (as illustrated in FIG. 4A); flipping it up about a hinge 62 (as illustrated in FIG. 4B); lifting it up by a hoist, winch, or other like mechanism 64 and translating it along a track 58 in the ceiling to which the lifting mechanism is engaged via rollers or wheels 56 (as illustrated in FIGS. 4C and 4D); simply lifting or raising it to the ceiling; or by removing it to a remote location by other like mechanisms as design constraints and/or available space permits. Preferably, associated structures, e.g., track 58, is constructed of a non-ferro magnetic material to avoid diversion and distortion of the magnetic flux.

When separating and rejoining the main magnet 20, alignment of the pole pieces 22, 24 is a consideration. During an MRI scan and/or the ramping up of the main magnetic 20, misalignment of the pole pieces 22, 24 has deleterious effects on imaging and is potentially damaging to the apparatus if unbalanced magnetic forces are exerted on the structures. With reference to FIG. 4D, for gross or rough mechanical alignment, the two pieces of the ferrous flux return path 26 are fitted with at least one pin 80 on one piece of the ferrous flux return path 26 and at least one pin receptor 82 on the other. When the ferrous flux return path 26 is joined and/or aligned such that the pole pieces 22, 24 are in proper alignment (on opposing sides of the subject 44) for an MRI experiment or scan, the pin 80 is received in the pin receptor 82. That is so say, the pin 80 and pin receptor 82 cooperate to safeguard against misalignment of the pole pieces 22, 24 in that only when properly aligned will the pin receptor 82 accept the pin 80. optionally, the abutting ends of the two pieces of the ferrous flux return path 26 may be cut or shaped in such a manner that only when the proper alignment is achieved will the two pieces fit together. The alignment is then automatically further secured, maintained, and fine tuned as the main magnet 20 is ramped up. When the MRI apparatus 10 is energized, the magnetic circuit in main magnet 20, including the main magnetic field and the magnetic flux through the ferrous flux return path 26, seeks to achieve a minimum energy state as a system. As a result, any misaligned pole pieces 22, 24 exert forces to move themselves into alignment, as this is a minimum energy state for the system. Furthermore, the system's inclination to a minimum energy state exerts forces to minimize and close any gaps in the ferrous flux return path 26. The sections on either side of the interface are pulled and/or attracted toward each other eliminating gaps and generating a frictional force therebetween fixing their relative orientation. Thus, even when a ring of roller bearings is placed around the pin in FIG. 4A, ramping up the magnet would force the rollers into tight, flux transmitting contact with the races. Analogously, the sections can be biased apart with spring members that are compressed by the magnetic forces to permit direct contact between the sections.

With reference to FIGS. 5A and 5B, the MRI apparatus 10 in the illustrated embodiment has a ferrous flux return path 26 divided into four parts 26a–d, each including a vertically extending column portion. Each column includes an upper and lower laterally extending portion associated with the pole pieces 22, 24 respectively. The laterally extending portions of each column meet at a central symmetrical location above and below the pole pieces 22, 24. In a preferred embodiment, gaps 22g and 24g behind the pole pieces 22, 24 separate the pole pieces from the lateral extensions. This reduces the amount of material associated with the ferrous flux return path 26, which in turn reduces its overall weight and eases mechanical constraints involved with its movement.

The pole pieces 22, 24 are surrounded by resistive or superconducting main field coils 28, 30. In the case of superconducting main field coils 28, 30, the coils are disposed in an annular helium cans 90 that are surrounded by vacuum dewars 92. The pole pieces 22, 24 are preferably circularly symmetric with a symmetrically contoured face for improving the magnetic field in the gap therebetween.

The pole pieces 22, 24 are disposed centrally and symmetrically with respect to the ferrous flux return path 26. More specifically, the pole pieces 22, 24 are displaced from each other by a distance 2x and are each displaced from the upper and lower lateral extensions of the four columns by a distance 1x. Each main field coil 28, 30 and pole piece 22, 24 is attracted to a magnetic reflection of itself in the adjoining lateral extensions. By positioning the pole pieces 22, 24 symmetrically between each other and the lateral extensions, the attractive force between the main field coils 28, 30 is balanced against the attractive force between each main field coils 28, 30 and its attraction to its magnetic image mirrored in the lower and upper lateral extensions. The main field coils 28, 30 and pole pieces 22, 24 can be positioned such that the net magnetic forces on them can be perfectly balanced. Of course, for patient safety, convenience in bringing the magnet 20 up to field, and supporting the gravity weight of the poles pieces 22, 24 and the field coils 28, 30, the pole pieces 22, 24 and main field coils 28, 30 are supported to the upper and lower lateral extensions, respectively, of one of the columns by non-ferrous structures 100.

Figure 5C:
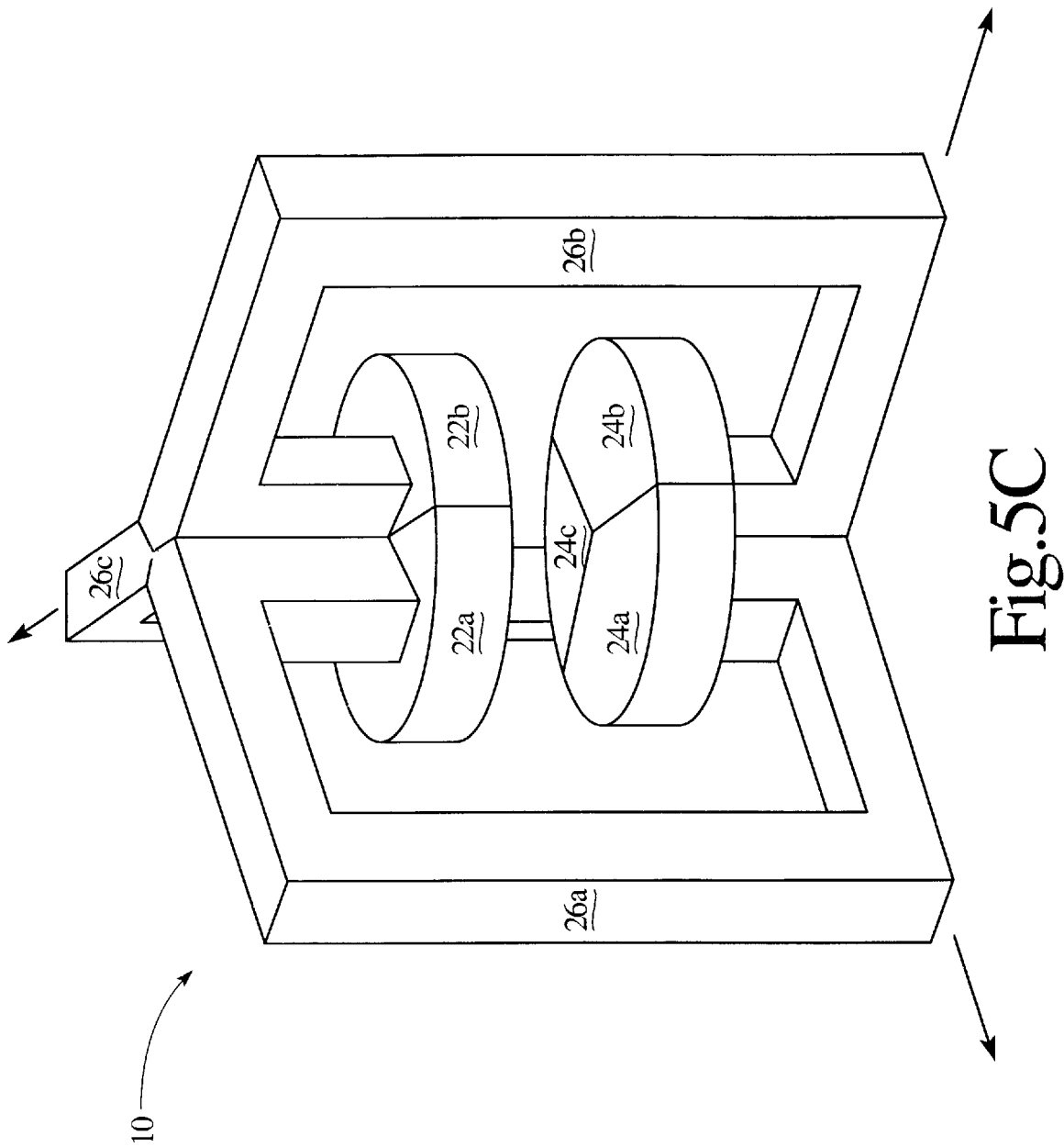
FIG. 5A is a diagrammatic illustration of a top view of a magnetic resonance imaging apparatus in accordance with the present invention.
FIG. 5B is a diagrammatic illustration of a side view along section line A of FIG. 5A of a magnetic resonance imaging apparatus in accordance with the present invention; and, FIG. 5C is a diagrammatic illustration of an alternate embodiment of a magnetic resonance imaging apparatus in accordance with the present invention.

With reference to FIG. 5C, an alternate embodiment of the magnetic resonance apparatus 10 illustrated in FIGS. 5A and 5B is shown having three ferrous flux return path 26a–c sections. The pole pieces 22, 24 are also divided into three sections 22a–c and 24a–c, respectively. Each portion of the pole pieces is moved with their respective sections of the ferrous flux return path 26a–c. Again, this lessens the mechanical constraints associated with the movement of any one section which otherwise would have the entire pole pieces connected thereto. Alternately, entire pole piece 22 may be connected to one section of the ferrous flux return path, i.e., 26a, while the other pole piece 24 is connected to another section of the ferrous flux return path, i.e., 26b. Moreover, it is to be appreciated that the number of sections into which the ferrous flux return path 26 and/or the pole pieces 22, 24 are divided is not limited to the illustrated embodiments but may be any appropriate number for the particular design parameters.

In any case, the spacing between and the arrangement of structures of the MRI assembly 10 is selected to be an appropriate height for attending physicians and equipment positioned therein, typically 240 cm or more. For a typical 65 cm gap in the examination region, the lateral extensions include projections 102, 104, respectively, which are spaced about 130 cm from each other. Of course, the projections 102, 104 need not be the same. Rather, their relative projection is selected such that a horizontal center of the examination region is at a convenient height for attending physicians, attendants, and technicians.

When improved patient or subject access is desired one or more of the U- or C-shaped columns 26a–d is separated and moved individually to remote locations by any of the previously described procedures as may be appropriate given the particular design parameters. In this manner, the weight load is divided a number of times and individual mechanical constraints associated with the movement of each pieces is significantly reduced.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus comprising:
   a couch for supporting a subject being examined; and,
   a main magnet which generates a substantially temporally constant main magnetic field through an examination region, the main magnet having:
   opposing pole pieces; and,
   a magnetic flux return path connecting the opposing pole pieces;

wherein at least a portion of the magnet is selectively moveable over a range of positions including at least a first position in which a region of interest of the subject is in the examination region and a second position in which the movable portion of the main magnet is displaced from the region of interest of the subject.

2. The magnetic resonance apparatus of claim 1, further including:

a drive which translates the movable portion of the main magnet along a track in a predefined path.

3. A magnetic resonance apparatus comprising:

a couch for supporting a subject being examined;

a main magnet which generates a substantially temporally constant main magnetic field through an examination region, the main magnet being arranged such that a portion of the magnet is selectively moveable over a range of positions including at least a first position in which a region of interest of the subject is in the examination region and a second position in which the movable portion of the main magnet is displaced from the region of interest of the subject; and a drive which rotates at least the movable portion of the main magnet about an axis.

4. A magnetic resonance imaging apparatus comprising:

a couch for supporting a region of interest of a subject being examined in an examination region; and, a main magnet for generating a substantially uniform, temporally constant main magnetic field through the examination region, the main magnet including;

a stationary pole piece arranged adjacent a first side of the examination region;

a moveable pole piece arranged to be selectively moved between a first position adjacent a second side of the examination region opposite the stationary pole piece so that the stationary and moveable pole pieces define the examination region therebetween, and a second position remote from the examination region;

a ferrous flux return path which connects the stationary and moveable pole pieces; and a magnetic flux generator for selectively generating a magnetic flux that flows between the poles pieces through the examination region and through the ferrous flux return path.

5. The magnetic resonance imaging apparatus of claim 4, wherein the ferrous flux return path includes at least two sections with abutting surfaces, a first section being connected to the stationary pole piece and a second section being connected to the movable pole piece, such that when the second section is moved relative to the first section the movable pole piece is moved between the first and second positions.

6. The magnetic resonance imaging apparatus of claim 5, wherein when the movable pole piece is in the first position the abutting surfaces of the sections are in physical contact with one another such that, as the magnetic flux generator is energized to generate magnetic flux, electromagnetic forces urge the pole pieces into alignment and urge the sections into abutment.

7. The magnetic resonance imaging apparatus of claim 6, wherein the first section and the second section are pivotally connected with each other.

8. The magnetic resonance imaging apparatus of claim 6, further including:

a pin disposed on one of the first and second sections; and, a pin receptor disposed on the other of the first and second sections, the pin being received in the pin receptor when the moveable pole piece is in the first position to facilitate mechanical alignment of the moveable and stationary pole pieces.

9. A method of magnetic resonance imaging comprising:

(a) supporting a region of interest of a subject within an examination region;

(b) keeping the subject stationary;

(c) moving a portion of a main magnet from a remote location to a location adjacent the examination region;

(d) generating a substantially uniform temporally constant main magnetic field through the examination region with the main magnet while returning an associated flux through a ferrous path;

(e) performing magnetic resonance imaging; and, (f) returning the portion of the main magnet to the remote location.

10. The method of claim 9, wherein the steps of moving and returning include rotating at least the portion of the main magnet about a horizontal axis.

11. The method of claim 9, wherein the steps of moving and returning include translating at least the portion of the main magnet along a track.

12. The method of claim 9 further including:

(g) generating of a medical diagnostic image of the region of interest as a result of the magnetic resonance imaging; and, (h) performing an invasive medical procedure in the region of interest after the portion of the main magnet is moved to the remote location.

13. The method of claim 9, wherein the moving and returning steps include moving and returning an upper pole piece between the remote location and a location adjacent and above the subject while maintaining a lower pole piece stationary and below the subject.

14. A method of magnetic resonance imaging comprising:

(a) supporting a region of interest of a subject within an examination region;

(b) keeping the subject stationary;

(c) rotating at least a pole piece of a main magnet around a vertical axis from a remote location to a location adjacent the examination region;

(d) generating a temporally constant main magnetic field through the examination region adjacent the at least one pole piece while returning an associated flux through a ferrous path;

(e) performing a magnetic resonance imaging procedure; and, (f) rotating at least the pole piece of the main magnet about a vertical axis to the remote location.

* * * * *